United States Patent [19]

Hillman et al.

[11] Patent Number: 5,094,884
[45] Date of Patent: Mar. 10, 1992

[54] METHOD AND APPARATUS FOR APPLYING A LAYER OF A FLUID MATERIAL ON A SEMICONDUCTOR WAFER

[75] Inventors: Gary Hillman, Livingston, N.J.; Robert D. Mohondro, Pleasanton, Calif.

[73] Assignee: Machine Technology, Inc., Parsippany, N.J.

[21] Appl. No.: 513,545

[22] Filed: Apr. 24, 1990

[51] Int. Cl.⁵ ............................. B05D 3/12; B05C 11/02
[52] U.S. Cl. ...................................... 427/240; 118/52; 118/320; 118/321; 427/421; 437/231
[58] Field of Search ............... 427/240, 421; 437/231; 118/52, 321, 320

[56] References Cited

U.S. PATENT DOCUMENTS

| | | | |
|---|---|---|---|
| 2,978,186 | 4/1961 | Mayerchak | 239/103 |
| 3,082,961 | 3/1963 | Hruby, Jr. | 239/598 |
| 3,174,693 | 3/1965 | Weber, Jr. | 239/422 |
| 3,198,657 | 8/1965 | Kimball et al. | 427/240 |
| 3,365,137 | 1/1968 | Corsette | 239/520 |
| 3,378,207 | 4/1968 | Huthsing, Jr. | 239/583 |
| 3,475,867 | 11/1969 | Walsh | 437/231 |
| 3,695,928 | 10/1972 | Boyer et al. | 427/240 |
| 4,007,464 | 2/1977 | Bassous et al. | 346/75 |
| 4,190,015 | 2/1980 | Hillman | 118/696 |
| 4,201,149 | 5/1980 | Koester et al. | 118/52 |
| 4,252,276 | 2/1981 | Aprea et al. | 239/391 |
| 4,267,212 | 5/1981 | Sakawaki | 427/240 |
| 4,385,083 | 5/1983 | Shelley | 427/240 |
| 4,451,507 | 5/1984 | Beltz et al. | 427/240 |
| 4,457,259 | 7/1984 | Samuels | 118/705 |
| 4,551,355 | 11/1985 | Ericson et al. | 427/48 |
| 4,561,486 | 12/1985 | Maeda et al. | 427/240 |
| 4,733,823 | 3/1988 | Waggener et al. | 239/601 |

*Primary Examiner*—Janyce Bell
*Attorney, Agent, or Firm*—Lerner, David, Littenberg, Krumholz & Mentlik

[57] ABSTRACT

An apparatus and method is disclosed for applying a uniform layer of a fluid material such as photoresist onto the surface of a rotating workpiece such as a semiconductor wafer. A dispensing nozzle is provided with a rectangular or oblong shaped opening for painting a broad swath of the fluid material onto the surface of the workpiece while the nozzle moves along a radial path inwardly from the peripheral edge of the workpiece. The use of a rectangular or oblong shaped nozzle opening minimizes the amount of fluid material being consumed while providing a uniform thin film coating on the workpiece surface.

21 Claims, 1 Drawing Sheet

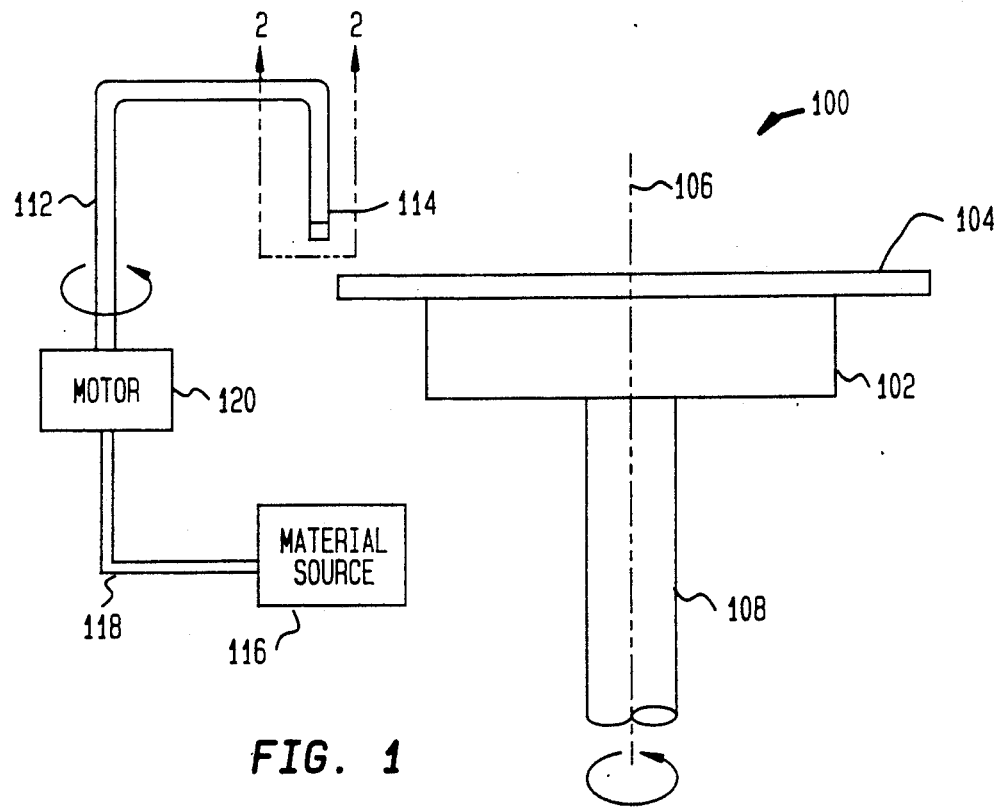
FIG. 1
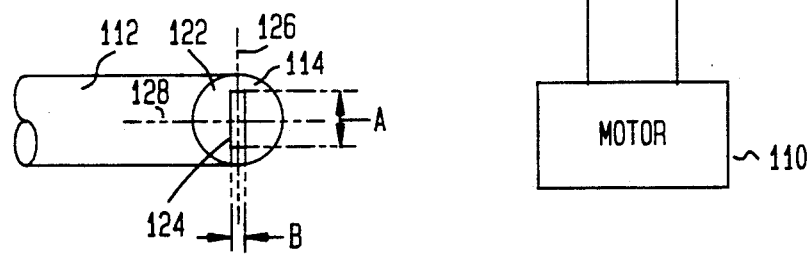
FIG. 2
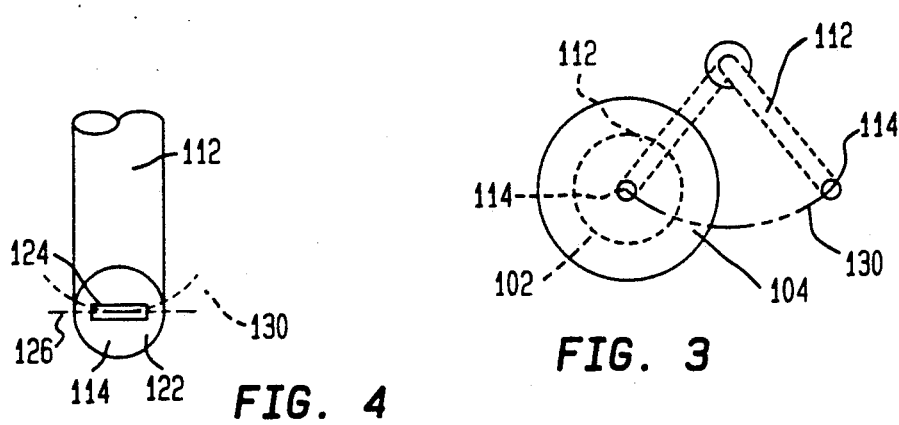
FIG. 4
FIG. 3

METHOD AND APPARATUS FOR APPLYING A LAYER OF A FLUID MATERIAL ON A SEMICONDUCTOR WAFER

BACKGROUND OF THE INVENTION

The present invention relates in general to an apparatus and method for processing workpieces which minimizes the use of coating materials, and more particularly, to an apparatus and method for applying a layer of a fluid material such as photoresist on the surface of a semiconductor wafer in a manner to reduce the consumption of photoresist being used, while at the same time maintaining or improving uniformity of the coating during processing of the wafer in the fabrication of integrated circuits and the like.

In the processing of workpieces such as semiconductor wafers for the ultimate manufacture of electronic components, one of the steps required is the dispensing of a fixed amount of a certain type of fluid material onto the surface of the wafer. For example, in the manufacture of integrated circuits, a photoresist may be dispensed onto a silicon wafer preliminary to the photo-etching of the wafer. In this regard, there is known from U.S. Pat. No. 4,190,015 an apparatus which dispenses a fixed amount of a fluid material onto a semiconductor wafer surface and is then spread evenly thereon, for example, by spinning the wafer at a high rate of speed. The fluid material is discharged from a nozzle in the form of a circular opening formed at the end of a length of hollow tubing.

U.S. Pat. No. 4,551,355 discloses rotating a disc at high speed on a spindle while fluid carrying magnetic medium material is applied to the disc through a circular dispensing nozzle which starts at the outside of the disc and travels to the inside diameter, pauses momentarily, and then travels back to the outside diameter. As the fluid is applied, a thin film of medium material adheres to the disc while the excess fluid forms a protective coating over this thin film as it flows radially off the disc due to the centrifugal force generated by the high speed rotation. The nozzle discharge pressure and the high rotational speed of the disc results in a very thin film of magnetic medium material being applied to the disc. The rate of nozzle travel can be adjusted to vary the medium material film thickness.

U.S. Pat. No. 3,198,657 discloses a process for spin coating objects with a pigmented material. The surface to be spin coated is first wetted by discharging the material from a cylindrical nozzle onto the spinning surface from the outer edge to the inner edge of the surface to be coated. The discharge of the coating material onto the spinning surface is continued using conventional spin coating techniques. The discharge of the coating material may be continued at the inner edge until an amount of material in excess of the amount necessary to cover the surface has been dispensed. In the alternative, the coating material may be continued at the inner edge only until a wave front of material is flowing outward over the spinning surface. In this event, the material is discharged from the inner edge to the outer edge either by dispensing behind the moving wave front or by pouring over and in front of the wave front. At the outer edge of the surface, discharge of the material is discontinued.

U.S. Pat. No. 4,457,259 discloses a spray apparatus which provides a predetermined, uniform quantity of liquid such as photoresist developer per unit area of surface by a parabolic cam mechanism, arranged to repeatedly reciprocate a circular nozzle at a predetermined linear velocity a plurality of times over a spinning semiconductor wafer. The mechanism moves the nozzle at a parabolic varying velocity such that the liquid is deposited at a uniform quantity per unit area. The cam is continuously rotated and engaged with a cam follower by a programmable timer which defines the spray period. A similar apparatus which dispenses the fluid through a circular nozzle in the form of a continuous spiral bead on a semiconductor wafer by means of a cam and cam follower arrangement is known from U.S. Pat. No. 4,451,507.

U.S. Pat. No. 4,267,212 discloses a process for spin coating a semiconductor wafer uniformly with a coating solution such as a photographic emulsion by rotating the wafer at a first speed while simultaneously applying the coating solution through a circular nozzle at a radially moving position. Once the semiconductor wafer has been initially covered, the speed of rotation of the wafer is increased and rotation continues until a uniform coating has been obtained. A similar process having a stationary nozzle is disclosed in U.S. Pat. No. 3,695,928.

In each of the aforedescribed apparatuses and methods, the fluid coating material is dispensed in a column of fluid whose cross-section approximates a circle, either during wafer rotation or while the wafer is stationary. Wafer coating is achieved by building up a pool of the fluid coating material in the nature of a thick layer and spin casting a film thereof by accelerating the rotation of the wafer about its own center in order to remove the excess material and to leave a thin film coating therebehind. The amount of fluid coating material, such as photoresist, remaining on the wafer is known to be a very small fraction of the amount that is initially dispensed, approximately one part in one thousand. This results in a substantial material loss of unusable photoresist along with its attendant cost. In addition, this creation of a pool of the fluid coating material on the wafer surface can result in the formation of uneven films which might adversely effect subsequent wafer processing.

Accordingly, there is an unsolved need for an apparatus and method which minimizes consumption of the coating material, such as photoresist, during spin casting and the like, as well as providing a more uniform thin film coating on semiconductor wafers during the fabrication of integrated circuits and other electronic components therefrom in the semiconductor industry.

SUMMARY OF THE INVENTION

One object of the present invention is to provide an apparatus and method for applying a thin layer of a fluid material such as photoresist on the surface of a wafer which eliminates pooling of the material.

Another object of the present invention is to provide an apparatus and method for applying a layer of a fluid material such as a photoresist on the surface of a wafer which reduces the amount of the material required for a given coating thickness.

Another object of the present invention is to provide an apparatus and method for applying a layer of a fluid material such as a photoresist on the surface of a wafer which enhances uniformity of coating thickness.

In accordance with one embodiment of the present invention, there is described an apparatus for applying a layer of a fluid material onto the surface of a wafer, the apparatus including a source of the fluid material, and a nozzle having a substantially rectangular shaped opening in communication with the source through which the fluid material is discharged in the form of a fluid stream onto the surface of the wafer.

In accordance with another embodiment of the present invention, there is described an apparatus for applying a layer of a fluid material onto the surface of a semiconductor wafer, the apparatus including a source of the fluid material, supporting means for supporting the wafer, rotating means for rotating the wafer about an axis thereof, a nozzle having a substantially rectangular shaped opening in communication with the source through which the fluid material is discharged in the form of a fluid stream onto the surface of the wafer, and moving means for moving the nozzle overlying a portion of the surface of the wafer.

In accordance with another embodiment of the present invention, there is described an apparatus for applying a layer of photoresist onto the surface of a semiconductor wafer, the apparatus including a source of the photoresist and a nozzle having an opening in communication with the source through which the photoresist is discharged in the form of a narrow elongated substantially rectangular fluid stream onto the surface of the wafer.

In accordance with another embodiment of the present invention, there is described a method for applying a layer of a fluid material onto the surface of a semiconductor wafer, the method including supporting a wafer, supplying fluid material to a nozzle having a substantially rectangular shaped opening, moving the nozzle overlying a portion of the surface of the wafer, and discharging the fluid material in the form of a fluid stream through the substantially rectangular shaped opening onto the surface of the wafer.

In accordance with another embodiment of the present invention, there is described a method for applying a layer of photoresist onto the surface of a semiconductor wafer, the method including supporting a semiconductor wafer, supplying fluid material to a nozzle having an opening, moving the nozzle overlying a portion of the surface of the wafer, and discharging the photoresist in the form of a narrow elongated substantially rectangular fluid stream onto the surface of the wafer.

BRIEF DESCRIPTION OF THE DRAWINGS

The above description, as well as further objects, features and advantages of the present invention will be more fully understood with reference to the following detailed description of a method and apparatus for applying a layer of fluid material on a semiconductor wafer, when taken in conjunction with the accompanying drawings, wherein:

FIG. 1 is a diagrammatic illustration of an apparatus in accordance with the present invention for applying a layer of a fluid material such as photoresist on the surface of a rotating wafer;

FIG. 2 is a cross-sectional view taken along line 2—2 in FIG. 1 showing the discharge nozzle having an elongated rectangular or oblong shaped opening;

FIG. 3 is a diagrammatic illustration showing radial movement of the discharge nozzle during dispensing of the fluid material onto the surface of the underlying wafer; and FIG. 4 is a diagrammatic illustration showing the path of travel of the major axis of the rectangular or oblong shaped opening of the discharged nozzle during dispensing of the fluid material onto the surface of the wafer.

DETAILED DESCRIPTION

The present invention provides an apparatus and method for dispensing a fluid coating material, for example, a photoresist, onto a spinning surface of a workpiece in a manner which reduces the consumption of photoresist used, while at the same time maintaining or improving uniformity. While the specific embodiment to be described utilizes photoresist useful in semiconductor processes in which a planar surface of a wafer is coated, the present invention can be practiced using other fluid coating materials useful in coating a continuous generally planar surface. Accordingly, the invention can be practiced to provide a coating of a fluid material in the semiconductor art, optical or compact disc art and other arts that utilize a spin coating process for coating fluid material on a substantially planar surface.

Referring now to the drawings, wherein like reference numerals in different figures denote like parts, depicted therein is an apparatus constructed in accordance with the principles of the present invention for dispensing a fixed amount of fluid material onto the surface of a workpiece. The apparatus generally designated by reference numeral 100 includes a chuck 102 for supporting a workpiece 104, such as a semiconductor wafer, optical disc, compact disc and the like. The workpiece 104 is releasably securable to the chuck 102 in a generally horizontal orientation by vacuum created therebetween as known, for example, from U.S. Pat. No. 4,711,610. However, it is also contemplated that the workpiece 104 may be held in a generally vertical orientation by the chuck 102 during the coating process. The chuck 102 and workpiece 104 are rotatable at high speeds about axis 106 by means of shaft 108 which is coupled at one end to a motor 110 or other such device. The workpiece 104 can be transported to the chuck 102 for processing by a transfer assembly (not shown) as conventionally known in, for example, the semiconductor art. One such transfer assembly which includes a cassette for housing a plurality of workpieces upon which the fluid material is to be dispensed is known from U.S. Pat. No. 4,190,015.

A hollow tubular dispensing arm 112 is arranged adjacent the chuck 102 for dispensing the fluid material through a nozzle 114. The fluid material to be dispensed is contained within a material source 116 which communicates with the nozzle 114 through the dispensing arm 112 by means of supply conduit 118. The dispensing arm 112 is rotated by a motor 120 for positioning the nozzle 114 selectively over the surface of the workpiece 104.

As shown in FIG. 2, the nozzle 114 includes a face portion 122 in which there is provided an elongated narrow rectangular or oblong shaped opening 124 having a longitudinal major axis 126 and a transverse minor axis 128. The length of the opening 124 along the major axis 126 is designated by dimension A. The width of the opening 124 along the minor axis 128 is designated by dimension B. In illustrating the opening 124 as shown in FIG. 2, it is to be understood that the opening for purposes of clarity has been illustrated with dimensions A and B being greatly exaggerated and not in proper proportion to each other. In this regard, it is contemplated that dimension A will be in the range of from about 0.125 to 0.5 inches, while dimension B will be in the range of from about 0.001 to 0.02 inches. However, it is to be understood that these ranges for dimensions A and B are only suggested and that other values of the respective dimensions A and B outside the specific ranges disclosed may be utilized in accordance with the present invention of providing a narrow rectangular or oblong shaped opening 124. As used hereinafter, the term substantially rectangular is meant to include both an elongated narrow rectangular and oblong shape.

Having now described the apparatus 100, the method of the present invention for applying a layer of a fluid material on the surface of a workpiece 104 will be described with specific reference to FIGS. 3 and 4. The workpiece 104 to be processed, such as a semiconductor wafer, is secured to the chuck 102. When it is desired to dispense the fluid material, the dispensing nozzle 114 is initially positioned overlying the peripheral edge of the workpiece 104. A valve (not shown) in the supply conduit 118 is opened for a set period of time to allow the fluid material from the material source 116 to be dispensed through nozzle 114 via dispensing arm 112 in the form of a non-aerated fluid stream. During this set period of time, the dispensing nozzle 114 is moved along a generally radial path 130 beginning at the peripheral edge of the workpiece 104 and terminating at its center. The nozzle 104 is moved along the radial path 130 by rotation of the dispensing arm 112 by means of motor 120. At the termination of the set period of time, the valve is closed, and simultaneously therewith, the nozzle 114 may be moved to its initial position as shown in FIG. 1. During dispensing of the fluid material, the workpiece 104 may be rotated at constant or varying speeds to achieve a uniform coating of a thin film of the desired fluid material.

Although the dispensing process has been described as occurring during movement of the nozzle 114 radially inward of the workpiece 104, it is to be understood that the dispensing operation may occur during radial outward movement of the nozzle if desired. In this regard, the nozzle 114 is initially positioned at a central location overlying the workpiece 104 prior to beginning the dispensing operation. Alternatively, the dispensing operation may be performed during both the radial inward and radial outward movement of the nozzle 114.

Referring to FIG. 4, the preferred alignment of the opening 124 with respect to the radial path 130 is shown. In this regard, the major axis 126 of the opening 124 follows along in alignment with the radial path 130. This results in the painting of a broad swath of the fluid material on the rotating workpiece 104. At the point of contact of the dispensed fluid material with the surface of the workpiece 104, the fluid stream has a generally rectangular or oblong cross-section. It is this generally narrow elongated rectangular or oblong shape of the dispensed stream of fluid material which enables the formation of a uniform coating on the workpiece 104 with a minimum loss of the fluid material.

Surface tension of the fluid material will ultimately effect the cross-sectional shape of the material subsequent to its discharge through the rectangular or oblong shaped opening 124. In this regard, surface tension will have the tendency to cause the discharge fluid stream to ultimately assume a circular shape at a location downstream from the opening 124. The nozzle 124 is therefore positioned a distance overlying the surface of the workpiece 104 where the cross-sectional shape of the dispensed fluid stream has retained substantially its narrow elongated rectangular or oblong shape. The distance between the surface of the workpiece 104 and the nozzle 114 required to maintain this shape of the fluid stream depends upon many factors. These factors include the viscosity of the fluid material being discharged, the temperature of the fluid material, the pressure of the fluid material at the point of discharge through the opening 124, and dimensions A and B of the opening. In the semiconductor art where the fluid material is a photoresist, the nozzle 114 will be located just off the surface of the semiconductor wafer, for example, in the range of about 0.005 to 0.50 inches. However, it is to be appreciated that this distance may be determined through trial and error as to the shape of the discharged stream of fluid material at the point of contact with the surface of the workpiece 104.

Although the invention herein has been described with references to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. An apparatus for applying a layer of a fluid material onto the surface of a wafer, said apparatus comprising a source of said fluid material, a nozzle having a narrow elongated opening in communication with said source through which said fluid material is discharged, and moving means for moving said nozzle over a radial path across the surface of said wafer while said fluid material is discharged through said opening onto the surface of said wafer.

2. The apparatus as set forth in claim 1, further including holding means for holding said wafer whereby the surface of said wafer is arranged in either a substantially horizontal or vertical orientation.

3. The apparatus as set forth in claim 1, further including rotating means for rotating said wafer about an axis arranged substantially transverse to the surface of said wafer.

4. The apparatus as set forth in claim 1, wherein said opening has a length of about 0.125 to 0.5 inches.

5. The apparatus as set forth in claim 4, wherein said opening has a width of about 0.001 to 0.02 inches.

6. An apparatus for applying a layer of a fluid material onto the surface of a semiconductor wafer, said apparatus comprising a source of said fluid material, supporting means for supporting said wafer, rotating means for rotating said wafer about an axis thereof, a nozzle having a substantially rectangular shaped opening in communication with said source through which said fluid material is discharged, and moving means for moving said nozzle overlying a portion of the surface of said wafer while said fluid material is discharged onto the surface of said wafer.

7. The apparatus as set forth in claim 6, wherein said substantially rectangular shaped opening has a length of about 0.125 to 0.5 inches.

8. The apparatus as set forth in claim 7, wherein said substantially rectangular shaped opening has a width of about 0.001 to 0.02 inches.

9. The apparatus as set forth in claim 6, wherein said substantially rectangular shaped opening has a minor axis and a major axis, said nozzle being moved by said moving means such that the major axis of said substantially rectangular shaped opening follows a substantially radial path over the surface of said wafer.

10. The apparatus as set forth in claim 6, wherein said moving means is operative for radial inward movement of said nozzle during which said fluid material is discharged through said substantially rectangular shaped opening.

11. The apparatus as set forth in claim 6, wherein said moving means is operative for radial outward movement of said nozzle during which said fluid material is discharged through said rectangular shaped opening.

12. A method for applying a layer of a fluid material onto the surface of a wafer, said method comprising supporting a wafer, supplying fluid material to a nozzle having a substantially rectangular shaped opening, moving said nozzle overlying a portion of the surface of said wafer, discharging said fluid material in the form of a fluid stream through said substantially rectangular shaped opening onto the surface of said wafer, and rotating said wafer about an axis thereof.

13. The method as set forth in claim 12, wherein said fluid material comprises photoresist.

14. The method as set forth in claim 12, wherein said fluid stream has a generally narrow elongated substantially rectangular cross-section.

15. The method as set forth in claim 12, wherein said fluid stream is non-aerated.

16. The method as set forth in claim 12, wherein said substantially rectangular shaped opening has a minor axis and a major axis, said nozzle being moved such that the major axis of said substantially rectangular shaped opening follows a substantially radial path over the surface of said wafer.

17. The method as set forth in claim 12, wherein said fluid material is discharged through said substantially rectangular shaped opening during radial inward movement of said nozzle.

18. The method as set forth in claim 12, wherein said fluid material is discharged through said substantially rectangular shaped opening during radial outward movement of said nozzle.

19. A method for applying a layer of photoresist onto the surface of a semiconductor wafer, said method comprising supporting a semiconductor wafer, supplying fluid material to a nozzle having an opening, moving said nozzle overlying a portion of the surface of said wafer, discharging said photoresist in the form of a narrow elongated substantially rectangular fluid stream onto the surface of said wafer, and rotating said wafer about an axis thereof.

20. The method as set forth in claim 19, wherein said opening is arranged overlying the surface of said wafer a distance less than 0.50 inches.

21. The method as set forth in claim 19, wherein said supporting said wafer comprises arranging the surface of said wafer in either a substantially horizontal or vertical orientation.

* * * * *